US006022410A

United States Patent [19]

Yu et al.

[11] Patent Number: 6,022,410

[45] Date of Patent: Feb. 8, 2000

[54] ALKALINE-EARTH METAL SILICIDES ON SILICON

[75] Inventors: Zhiyi Yu; Jun Wang, both of Gilbert; Ravindranath Droopad, Tempe; Daniel S. Marshall, Chandler; Jerald A. Hallmark, Gilbert; Jonathan K. Abrokwah, Tempe, all of Ariz.

[73] Assignee: Motorola, Inc., Schaumburg, Ill.

[21] Appl. No.: 09/144,921

[22] Filed: Sep. 1, 1998

[51] Int. Cl.[7] .................... C30B 23/00

[52] U.S. Cl. .................... 117/103; 117/108; 117/939

[58] Field of Search .................... 117/103, 108, 117/939; 423/263, 344

[56] References Cited

U.S. PATENT DOCUMENTS 4,554,045 11/1985 Bean et al. .................... 117/105

5,225,031 7/1993 McKee et al. .................... 428/471

*Primary Examiner*—Benjamin L. Utech

*Assistant Examiner*—Donald L. Champagne

*Attorney, Agent, or Firm*—Eugene A. Parsons

[57] ABSTRACT

A method of forming a thin silicide layer on a silicon substrate 12 including heating the surface of the substrate to a temperature of approximately 500° C. to 750° C. and directing an atomic beam of silicon 18 and an atomic beam of an alkaline-earth metal 20 at the heated surface of the substrate in a molecular beam epitaxy chamber at a pressure in a range below $10^{-9}$ Torr. The silicon to alkaline-earth metal flux ratio is kept constant (e.g. Si/Ba flux ratio is kept at approximately 2:1) so as to form a thin alkaline-earth metal silicide layer (e.g. $BaSi_2$) on the surface of the substrate. The thickness is determined by monitoring in situ the surface of the single crystal silicide layer with RHEED and terminating the atomic beam when the silicide layer is a selected submonolayer to one monolayer thick.

22 Claims, 1 Drawing Sheet

25

25

ALKALINE-EARTH METAL SILICIDES ON SILICON

FIELD OF THE INVENTION

The present invention pertains to methods of preparing crystalline alkaline earth metal silicides on a silicon substrate in preparation for further fabrication processes.

BACKGROUND OF THE INVENTION

An ordered and stable silicon (Si) surface is most desirable for subsequent epitaxial growth of single crystal thin films on silicon for numerous device applications, e.g., ferroelectrics or high dielectric constant oxides for non-volatile and high density memory devices. It is pivotal to establish an ordered transition layer on Si surface, especially for subsequent growth of single crystal oxides, e.g. perovskites. Some reported successful growth of these oxides, such as BaO and $BaTiO_3$ on Si(100) was based on a $BaSi_2$ (cubic) template by depositing one fourth monolayer of Ba on Si(100) using reactive epitaxy at temperatures greater than 850° C. See for example: R. McKee, et al., *Appl. Phys. Lett.* 59(7), pp, 782–784, (Aug. 12, 1991); R. McKee, et al., *Appl. Phys. Lett.* 63(20), pp, 2818–2820, (Nov. 15, 1993); R. McKee et al., *Mat. Res. Soc. Symp. Proc.,* Vol. 21, pp. 131–135, (1991); U.S. Pat. No. 5,225,01, issued Jul. 6, 1993, entitled "Process for Depositing an Oxide Epitaxially onto a Silicon Substrate and Structures Prepared with the Process"; and U.S. Pat. No. 5,482,003, issued Jan. 9, 1996, entitled "Process for Depositing Epitaxial Alkaline Earth Oxide onto a Substrate and Structures Prepared with the Process". The high temperature requirement for the Molecular Beam Epitaxy surface preparation and template (e.g. $BaSi_2$) formation truly makes the above mentioned process a high temperature process. The major problems are that this high temperature process requires a much higher thermal budget, promotes diffusion in the structure, and often could be detrimental to device reliability.

It is highly desirable, therefore, to have a Molecular Beam Epitaxy compatible low temperature process that is simple to perform and that provides an ordered wafer surface for subsequent thin film epitaxy.

It is a purpose of the present invention to provide a new and improved method of preparing crystalline alkaline earth metal silicides on a Si substrate.

It is another purpose of the present invention to provide a new and improved method of preparing crystalline alkaline earth metal silicides on a Si substrate using Molecular Beam Epitaxy compatible low temperatures.

It is still another purpose of the present invention to provide a new and improved method of preparing crystalline alkaline earth metal silicides on a Si substrate using a simplified method that requires very little monitoring during the process.

It is a further purpose of the present invention to provide a new and improved method of preparing crystalline alkaline earth metal silicides on a Si substrate which provides an ordered wafer surface.

It is still a further purpose of the present invention to provide a new and improved method of preparing crystalline alkaline earth metal suicides on a Si substrate which does not unnecessarily complicate subsequent process steps.

SUMMARY OF THE INVENTION

The above problems and others are at least partially solved and the above purposes and others are realized in a method of fabricating crystalline alkaline-earth metal silicides on a silicon substrate including the steps of providing a silicon substrate with a selected surface and sources of silicon and an alkaline-earth metal. The surface of the silicon substrate is clean and may be hydrogen terminated. The surface of the silicon substrate is heated to a temperature below approximately 750° C. (long enough to drive off the hydrogen termination, if present) and an atomic beam of the silicon and an atomic beam of the alkaline-earth metal are directed at the heated surface of the silicon substrate in a molecular beam epitaxy chamber so as to form a thin (submonolayer to monolayer) alkaline-earth metal silicide layer on the surface of the silicon substrate. Additional thickness of an alkaline earth metal oxide, single crystal ferroelectrics or high dielectric constant oxides on silicon for non-volatile and high density memory device applications can then be conveniently formed on the alkaline earth metal oxide, depending upon the application.

In specific applications the alkaline-earth metal includes a single or multiple alkaline earth metals and the flux ratio of the silicon to the alkaline-earth metal is maintained at a constant ratio.

BRIEF DESCRIPTION OF THE DRAWINGS

Referring to the drawings.

DESCRIPTION OF THE PREFERRED EMBODIMENT

Epitaxial transition layers are critical for subsequent single crystal growth of additional thicknesses of alkaline earth metal oxides, single crystal ferroelectrics or high dielectric constant oxides on a silicon substrate. It has been proven that alkaline earth metals, such as barium, strontium, calcium, etc., can form a stable template on a silicon substrate. $BaSi_2$/BaO transition layers, for example, have been grown on silicon substrates by molecular beam epitaxy (MBE) as described in the articles and patents cited above. These transition layers are grown on clean Si substrate surfaces by reactive epitaxy and MBE. However, the prior art sub-monolayer $BaSi_2$ growth requires extremely high temperatures (in excess of 850° C.) and precise thickness control. The high temperatures and precise thickness controls complicate the prior art growth processes, substantially increasing the cost and time of the process.

Figure 1:
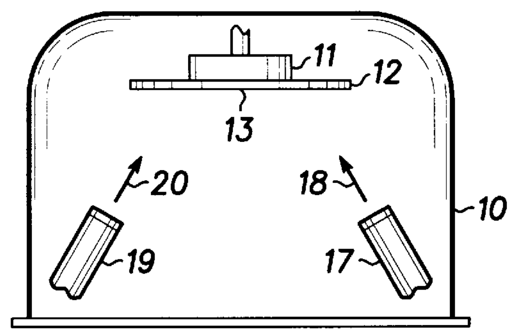
FIG. 1 illustrates a simplified molecular beam epitaxy system as used in the present method.
Figure 2:
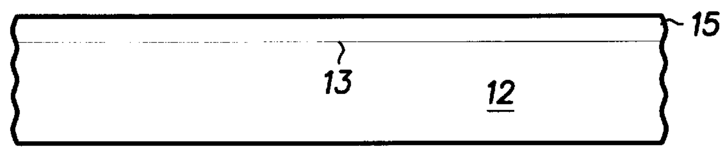
FIGS. 2 through 4 are simplified sectional views illustrating several steps in the present method.

Turning now to the drawings in which like characters are designated with like numbers throughout, FIG. 1 illustrates a simplified molecular beam epitaxy system as used in the present method. The system includes a molecular beam epitaxy (MBE) growth chamber 10 with some conventional means 11 for mounting a silicon (Si) substrate 12 with a selected surface 13 exposed. Surface 13 should be thoroughly cleaned, using any of the conventional cleaning procedures, and can be hydrogen terminated after cleaning to protect it from oxidation or it may have a silicon oxide coating (generally $SiO_2$). Hydrogen termination is a well known process in which hydrogen is loosely bonded to dangling bonds of the silicon atoms at surface 13 (similar to the silicon oxide) to complete the crystalline structure. Referring specifically to FIG. 2, a sectional view of substrate 12 is illustrated with an optional protective coating 15 of silicon oxide or hydrogen termination formed on surface 13.

Si substrate 12 and protective coating 15, if present, are heated to a temperature in a range of approximately 500° C. to 750° C. or 800° C. to 850° C. to drive off protective coating 15 whether it is hydrogen or silicon oxide, respectively. Surface 13 of silicon substrate 12 is monitored in situ, during the heating, with the well known technique commonly referred to as reflection high energy electron diffraction (RHEED), until a (2×1) RHEED pattern is obtained. The (2×1) RHEED pattern indicates that surface 13 is pure single crystalline silicon and is free of any hydrogen or oxygen bonds. This can be accomplished in MBE growth chamber 10 or substrate 12 can be at least partially heated in a preparation chamber (not shown) after which substrate 12 can be transferred to growth chamber 10 and the heating completed. The pressure in growth chamber 10 is reduced to a pressure below $10^{-9}$ Torr.

Figure 3:
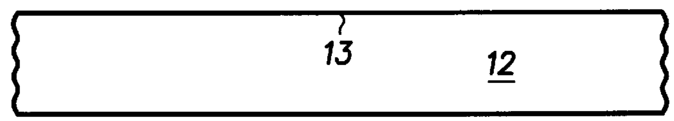
Figure 4:
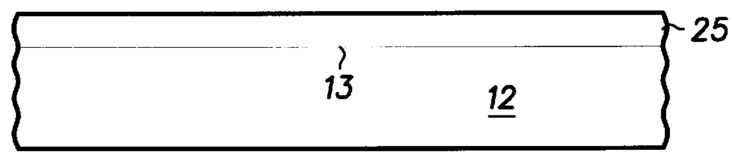

After protective coating 15 is removed, as illustrated in FIG. 3, substrate 12 is maintained at an appropriate temperature, generally in the range of approximately 500° C. to 750° C. Once the pressure in growth chamber 10 has been reduced appropriately, surface 13 of substrate 12 is exposed to simultaneous atomic beams of one or more alkaline earth metals and an atomic beam of silicon. Referring again to FIG. 1, a source 17 of high purity silicon or silicon atoms is provided within growth chamber 10 so as to direct an atomic beam 18 of high purity silicon onto surface 13. Similarly, one or more sources 19 of a high purity alkaline-earth metal or alkaline-earth metal atoms are provided within growth chamber 10 so as to direct an atomic beam 20 of high purity alkaline-earth metal onto surface 13.

Atomic beam 20 may be, for example, barium. In a preferred embodiment, the barium and silicon atomic beams 20 and 18 are generated by resistively heating effusion cells or from e-beam evaporation sources. Heated surface 13 of substrate 12 is exposed to atomic beam 18 of silicon and, simultaneously, to atomic beam 20 of barium. The flux of atomic beams 18 and 20 is maintained constant and a constant flux ratio is maintained between atomic beams 18 and 20, depending upon the alkaline-earth metal or metals being deposited. In the example where atomic beam 20 is barium, the flux ratio between atomic beam 18 and atomic beam 20 is approximately 2:1. The combination of atomic beams 18 and 20 forms a single crystal alkaline-earth metal silicide layer 25 on surface 13 of silicon substrate 12. In the present example, a thin layer 25 of barium silicide ($BaSi_2$) is grown on surface 13.

The epitaxial growth rate of layer 25 is monitored in situ by reflection high energy electron diffraction (RHEED). The growth rate is pre-calibrate d by RHEED intensity oscillation so accurately that a monolayer or submonolayer thick template is grown in a controllable fashion. Thus, the step of directing atomic beam 18 of silicon and atomic beam 20 of alkaline-earth metal at heated surface 13 of silicon substrate 12 can be easily terminated when single crystal alkaline-earth metal silicide layer 25 is no greater than one monolayer thick, e.g. one monolayer, one half monolayer, one quarter monolayer, etc.

Figure 5:
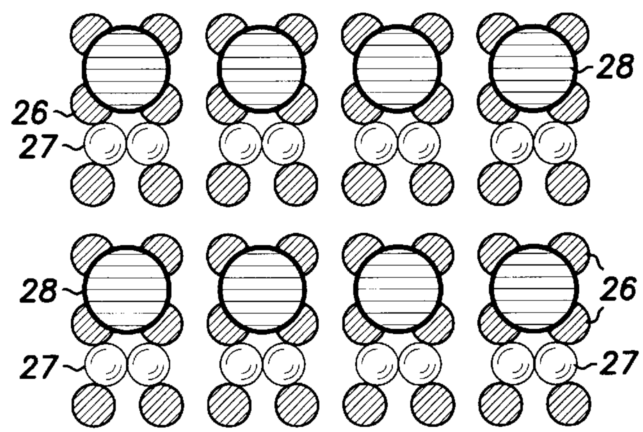
FIGS. 5 and 6 are greatly enlarged top plan and side elevational views, respectively, of a simplified atomic structure for a layer of single crystal alkaline-earth metal silicide formed on a surface of a silicon substrate in accordance with the present invention.
Figure 6:
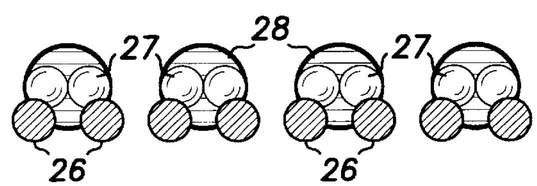

Turning now to FIGS. 5 and 6, greatly enlarged views are illustrated of a simplified atomic structure for layer 25 in top plan and side elevation, respectively. Silicon atoms defining surface 13 of silicon substrate 12 are represented by ordered balls designated 26, hereinafter referred to as surface atoms 26. Silicon atoms provided by atomic beam 18 are represented by ordered balls designated 27, hereinafter referred to as silicon atoms 27. Barium atoms provided by atomic beam 20 are represented by ordered balls designated 28, hereinafter referred to as barium atoms 28. Thus, it can be seen that silicon atoms 27 and barium atoms 28 form single crystal barium silicide, which is bonded to surface atoms 26 to form an ordered surface. It will be noted that surface atoms 26 are regularly positioned in a normal single crystal silicon structure throughout the epitaxial growth so as to produce a (2×1) RHEED pattern.

Thus, by providing the additional silicon for the single crystal alkaline-earth metal silicide growth, the process can be performed at a much lower temperature, compared to the prior art high temperature reactive epitaxy processes (e.g. 500° C. to 750° C. versus the prior arts' requirement of greater than 850° C.). Further, because the alkaline-earth metal atoms do not need to combine with the crystalline structure of the silicon substrate, layer 25 has a smoother silicide/silicon interface with better stoichiometry, thickness and quality control.

In another specific example, source 19 includes sources of barium and strontium. In this example, two separate atomic beams, one of barium and one of strontium, are directed at surface 13 along with atomic beam 18 of silicon. The result is a single crystal alkaline-earth metal silicide $(Ba,Sr)Si_2$. In this example it is preferred that surface 13 of silicon substrate 12 is the (100) crystalline surface, since $(Ba,Sr)Si_2$ has a better lattice match with the (100) surface. In this instance the flux ratio of the silicon atomic beam to the combined barium and strontium beams is maintained at a constant 2:1 flux ratio. The flux of atomic beams of barium and strontium may be equal or varied relative to each other to achieve different specific characteristics of the resulting single crystal alkaline-earth metal silicide layer.

Thus, a Molecular Beam Epitaxy compatible low temperature process is disclosed which is simple to perform and which provides an ordered wafer surface for subsequent thin film epitaxy. The new and improved method of preparing crystalline alkaline earth metal silicides on a Si substrate use Molecular Beam Epitaxy compatible low temperatures and require very simple monitoring during the process. Further, as a result of the new process, a smoother silicide/silicon interface is obtained with relatively easy thickness and stoichiometric control. Also, with the new process it is easier to grow thicker films, if needed, compared to the prior art reactive epitaxy processes.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of fabricating crystalline alkaline-earth metal silicide on a silicon substrate comprising the steps of:

providing a silicon substrate with a surface;

providing a source of silicon and a source of an alkaline-earth metal;

heating the surface of the silicon substrate to a temperature below approximately 750° C.; and directing a beam of the silicon and a beam of the alkaline-earth metal at the heated surface of the silicon substrate in a molecular beam epitaxy chamber so as to form a single crystal alkaline-earth metal silicide layer on the surface of the silicon substrate.

2. A method of fabricating crystalline alkaline-earth metal silicide on a silicon substrate as claimed in claim 1 wherein the step of providing the silicon substrate with the surface includes providing a silicon substrate with a hydrogen terminated surface.

3. A method of fabricating crystalline alkaline-earth metal silicide on a silicon substrate as claimed in claim 1 wherein the step of heating the surface of the silicon substrate includes heating the surface of the silicon substrate to a temperature in a range from approximately 500° C. to approximately 750° C.

4. A method of fabricating crystalline alkaline-earth metal silicide on a silicon substrate as claimed in claim 3 wherein the step of heating the surface of the silicon substrate to the temperature in the range from approximately 500° C. to approximately 750° C. includes heating the surface of the silicon substrate and monitoring in situ the surface with reflection high energy electron diffraction (RHEED) until a (2×1) RHEED pattern is obtained.

5. A method of fabricating crystalline alkaline-earth metal silicide on a silicon substrate as claimed in claim 1 wherein the molecular beam epitaxy chamber is maintained at a pressure in a range below $10^{-9}$ Torr.

6. A method of fabricating crystalline alkaline-earth metal silicide on a silicon substrate as claimed in claim 1 including in a step of monitoring in situ a surface of the single crystal silicide layer with reflection high energy electron diffraction (RHEED) and terminating the step of directing the beam of the silicon and the beam of the alkaline-earth metal at the heated surface of the silicon substrate when the single crystal alkaline-earth metal silicide layer is no greater than one monolayer thick.

7. A method of fabricating crystalline alkaline-earth metal silicide on a silicon substrate as claimed in claim 1 wherein the step of directing the beam of the silicon and the beam of the alkaline-earth metal at the heated surface of the silicon substrate includes maintaining a constant silicon to alkaline-earth metal flux ratio.

8. A method of fabricating crystalline alkaline-earth metal silicide on a silicon substrate as claimed in claim 7 wherein the alkaline-earth metal includes barium and the step of maintaining the constant silicon to alkaline-earth metal flux ratio includes maintaining a constant Si/Ba flux ratio at 2:1.

9. A method of fabricating crystalline alkaline-earth metal silicide on a silicon substrate as claimed in claim 7 wherein the step of providing the source of alkaline-earth metal includes providing multiple alkaline-earth metal sources.

10. A method of fabricating crystalline alkaline-earth metal silicide on a silicon substrate as claimed in claim 9 wherein the step of providing multiple alkaline-earth metal sources includes providing sources of barium and strontium.

11. A method of fabricating crystalline alkaline-earth metal silicide on a silicon substrate as claimed in claim 10 wherein the step of providing the silicon substrate with the surface includes providing a silicon substrate with a (100) surface.

12. A method of fabricating crystalline alkaline-earth metal silicide on a silicon substrate comprising the steps of:

providing a silicon substrate with a surface;

providing a source of silicon and a source of an alkaline-earth metal;

heating the surface of the silicon substrate to a temperature in a range of approximately 500° C. to approximately 750° C., while simultaneously monitoring in situ the surface with reflection high energy electron diffraction (RHEED), until a (2×1) RHEED pattern is obtained;

directing an atomic beam of the silicon and an atomic beam of the alkaline-earth metal at the heated surface of the silicon substrate in a molecular beam epitaxy chamber maintained at a pressure in a range below $10^{-9}$ Torr, while maintaining a constant silicon to alkaline-earth metal flux ratio, so as to form a single crystal alkaline-earth metal silicide layer on the surface of the silicon substrate; and monitoring in situ the surface of the single crystal silicide layer with reflection high energy electron diffraction (RHEED) and terminating the step of directing the atomic beam of the silicon and the atomic beam of the alkaline-earth metal at the heated surface of the silicon substrate when the single crystal alkaline-earth metal silicide layer is no greater than one monolayer thick.

13. A method of fabricating crystalline alkaline-earth metal silicide on a silicon substrate as claimed in claim 12 wherein the step of providing the silicon substrate with the surface includes providing a silicon substrate with a hydrogen terminated surface.

14. A method of fabricating crystalline alkaline-earth metal silicide on a silicon substrate as claimed in claim 12 wherein the alkaline-earth metal includes barium and the step of maintaining the constant silicon to alkaline-earth metal flux ratio includes maintaining a constant Si/Ba flux ratio at approximately 2:1.

15. A method of fabricating crystalline alkaline-earth metal silicide on a silicon substrate as claimed in claim 12 wherein the step of providing the source of alkaline-earth metal includes providing multiple alkaline-earth metal sources.

16. A method of fabricating crystalline alkaline-earth metal silicide on a silicon substrate as claimed in claim 15 wherein the step of providing multiple alkaline-earth metal sources includes providing sources of barium and strontium.

17. A method of fabricating crystalline alkaline-earth metal silicide on a silicon substrate as claimed in claim 16 wherein the step of providing the silicon substrate with the surface includes providing a silicon substrate with a (100) surface.

18. A method of fabricating crystalline alkaline-earth metal silicide on a silicon substrate comprising the steps of:

providing a silicon substrate with a clean hydrogen terminated surface;

providing a source of silicon atoms and a source of alkaline-earth metal atoms;

heating the surface of the silicon substrate to a temperature in a range of approximately 500° C. to approximately 750° C., while simultaneously monitoring in situ the surface with reflection high energy electron diffraction (RHEED), until a (2×1) RHEED pattern is obtained;

directing a beam of the silicon atoms and a beam of the alkaline-earth metal atoms at the heated surface of the silicon substrate in a molecular beam epitaxy chamber maintained at a pressure in a range below $10^{-9}$ Torr, while maintaining a constant silicon to alkaline-earth metal flux ratio, so as to form a single crystal silicide layer on the surface of the silicon substrate; and monitoring in situ the surface of the single crystal silicide layer with reflection high energy electron diffraction (RHEED) and terminating the step of directing the beam of the silicon atoms and the beam of the alkaline-earth metal atoms at the heated surface of the silicon substrate when the single crystal silicide layer is no greater than one monolayer thick.

19. A method of fabricating crystalline alkaline-earth metal silicide on a silicon substrate as claimed in claim 18 wherein the step of providing the source of alkaline-earth metal atoms includes providing a source of barium atoms and the step of directing includes directing a beam of the barium atoms at the heated surface of the silicon substrate while maintaining a constant silicon to barium flux ratio of approximately 1:2.

20. A method of fabricating crystalline alkaline-earth metal silicide on a silicon substrate as claimed in claim 18 wherein the step of providing the source of alkaline-earth metal atoms includes providing multiple alkaline-earth metal atom sources.

21. A method of fabricating crystalline alkaline-earth metal silicide on a silicon substrate as claimed in claim 20 wherein the step of providing multiple alkaline-earth metal atom sources includes providing a barium atom source and a strontium atom source and the step of directing includes directing a beam of the barium atoms at the heated surface of the silicon substrate and simultaneously directing a beam of the strontium atoms at the heated surface of the silicon substrate while maintaining a constant silicon to barium, strontium flux ratio of approximately 1:2.

22. A method of fabricating crystalline alkaline-earth metal silicide on a silicon substrate as claimed in claim 21 wherein the step of providing the silicon substrate with the surface includes providing a silicon substrate with a (100) surface.

* * * * *